US012760418B2

(12) United States Patent
Yoshikawa

(10) Patent No.: US 12,760,418 B2
(45) Date of Patent: Oct. 13, 2026

(54) GAS SUPPLY UNIT AND SUBSTRATE PROCESSING APPARATUS INCLUDING GAS SUPPLY UNIT

(71) Applicant: ASM IP Holding B.V., Almere (NL)

(72) Inventor: Jun Yoshikawa, Hachioji (JP)

(73) Assignee: ASM IP Holding B.V., Almere (NL)

( * ) Notice: Subject to any disclaimer, the term of this patent is extended or adjusted under 35 U.S.C. 154(b) by 553 days.

(21) Appl. No.: 18/088,255

(22) Filed: Dec. 23, 2022

(65) Prior Publication Data

US 2023/0203656 A1 Jun. 29, 2023

Related U.S. Application Data

(60) Provisional application No. 63/294,105, filed on Dec. 28, 2021.

(51) Int. Cl.
*C23C 16/455* (2006.01)

(52) U.S. Cl.
CPC .. *C23C 16/45565* (2013.01); *C23C 16/45561* (2013.01); *C23C 16/4558* (2013.01)

(58) Field of Classification Search
CPC ........ C23C 16/45565; C23C 16/45561; C23C 16/4558; C23C 16/50; C23C 16/455; C23C 16/45591; C23C 16/45502; C23C 16/45574; C23C 16/5096
USPC ........................ 118/715; 156/345.33, 345.34
See application file for complete search history.

(56) References Cited

U.S. PATENT DOCUMENTS

| | | | | |
|---|---|---|---|---|
| 6,245,192 | B1 * | 6/2001 | Dhindsa | C23C 16/45572 438/731 |
| 7,104,476 | B2 * | 9/2006 | Kim | C23C 16/45551 239/557 |
| 7,658,800 | B2 * | 2/2010 | Chen | C23C 16/45565 156/345.34 |
| 8,277,888 | B2 * | 10/2012 | Dedontney | B01J 19/0046 118/728 |
| 8,778,079 | B2 | 7/2014 | Begarney et al. | |
| 9,121,097 | B2 * | 9/2015 | Mohn | C23C 16/45589 |
| 9,728,380 | B2 * | 8/2017 | Mohn | C23C 16/45589 |
| 10,145,012 | B2 * | 12/2018 | Je | C23C 16/45565 |
| 10,651,016 | B2 * | 5/2020 | Huang | H01J 37/3244 |
| 10,851,457 | B2 * | 12/2020 | Shaikh | H01L 21/02274 |
| 11,482,418 | B2 | 10/2022 | Nakano | |
| 2004/0134611 | A1 * | 7/2004 | Kato | C23C 16/455 156/345.33 |

(Continued)

*Primary Examiner* — Rudy Zervigon
(74) *Attorney, Agent, or Firm* — Snell & Wilmer L.L.P.

(57) ABSTRACT

A gas supply unit is disclosed. Exemplary gas supply unit includes an upper plate provided with a plurality of injection holes, the plurality of injection holes comprising a center injection hole and a plurality of outer injection holes; a divider plate constructed and arranged against the upper plate to guide a flow of gas from the injection holes; a first gas line fluidly coupled to the center injection hole; and a plurality of second gas lines fluidly coupled to the plurality of outer injection holes. The plurality of outer injection holes is arranged concentrically around the center injection hole. The divider plate is provided with a center through hole fluidly communicating with the center injection hole and is provided with a plurality of protrusions extending towards the upper plate thereby creating a plurality of zones, each of the zones fluidly communicating with one of the outer injection holes.

18 Claims, 7 Drawing Sheets

(56) References Cited

U.S. PATENT DOCUMENTS

| | | | | |
|---|---|---|---|---|
| 2005/0263248 | A1 * | 12/2005 | Rocha-Alvarez | C23C 16/45574 216/37 |
| 2006/0191637 | A1 * | 8/2006 | Zajac | H01J 37/3244 156/345.34 |
| 2009/0107403 | A1 * | 4/2009 | Moshtagh | C23C 16/45572 118/728 |
| 2012/0064698 | A1 * | 3/2012 | Olgado | C23C 16/45565 118/715 |
| 2012/0111271 | A1 * | 5/2012 | Begarney | C23C 16/45565 118/724 |
| 2013/0341433 | A1 * | 12/2013 | Roy | C23C 16/45565 239/548 |
| 2014/0203702 | A1 * | 7/2014 | Amikura | H01J 37/32091 313/231.31 |
| 2015/0184287 | A1 * | 7/2015 | Tsung | C23C 16/04 427/255.28 |
| 2018/0269036 | A1 * | 9/2018 | Huang | C23C 16/45563 |
| 2021/0142984 | A1 * | 5/2021 | Ruan | H01L 21/6719 |
| 2022/0093373 | A1 * | 3/2022 | Tong | H01J 37/3244 |
| 2022/0108876 | A1 | 4/2022 | Aida | |

* cited by examiner

GAS SUPPLY UNIT AND SUBSTRATE PROCESSING APPARATUS INCLUDING GAS SUPPLY UNIT

CROSS-REFERENCE TO RELATED APPLICATIONS

This application claims priority to U.S. Provisional Patent Application Ser. No. 63/294,105 filed Dec. 28, 2021 titled GAS SUPPLY UNIT AND SUBSTRATE PROCESSING APPARATUS INCLUDING GAS SUPPLY UNIT, the disclosure of which is hereby incorporated by reference in its entirety.

FIELD OF INVENTION

The present disclosure relates generally to a gas supply unit and a substrate processing apparatus including the gas supply unit, and more particularly, to a gas supply unit capable of controlling film deposition on a specific portion of a substrate, and a substrate processing apparatus including the gas supply unit.

BACKGROUND OF THE DISCLOSURE

In a process of manufacturing a semiconductor device, as a circuit line width decreases, more precise process control has been required. In a film deposition process, various efforts to achieve high film uniformity have been made.

One of major factors for achieving uniform film deposition is a gas supply unit. A shower plate is used for a common gas supply unit. The shower plate has a capability of uniformly supplying a gas onto a substrate in a coaxial shape. However, the thickness of a film at an edge portion of the substrate and the thickness of a film at a center portion of the substrate may not be the same due to, for example, gas flows in an exhaust port and gate valve.

Any discussion, including discussion of problems and solutions, set forth in this section, has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In accordance with exemplary embodiments of the disclosure, a gas supply unit is provided. The gas supply unit comprises an upper plate provided with a plurality of injection holes, the plurality of injection holes comprising a center injection hole and a plurality of outer injection holes; a divider plate constructed and arranged against the upper plate to guide a flow of gas from the injection holes; a first gas line fluidly coupled to the center injection hole; and a plurality of second gas lines fluidly coupled to the plurality of outer injection holes. The plurality of outer injection holes is arranged concentrically around the center injection hole. The divider plate is provided with a center through hole fluidly communicating with the center injection hole and is provided with a plurality of protrusions extending towards the upper plate thereby creating a plurality of zones, each of the zones fluidly communicating with one of the outer injection holes.

In various embodiments, a first liquid gas line and a first dry gas line may be configured to connect to an upstream of the first gas line.

In various embodiments, the gas supply unit may further comprise a second liquid gas line and a second dry gas line configured to connect to an upstream of the second gas lines.

In various embodiments, at least one of the zones may be provided with a substantially trapezoidal shape.

In various embodiments, the number of the zones may be four, wherein the size of one zone may be bigger than that of the other three zones.

In various embodiments, the protrusions may be arranged radially from the center to the outside.

In various embodiments, the gas supply unit may further comprise a shower plate provided with a plurality of holes to guide a flow of gas outside the gas supply unit, wherein the shower plate is attached to a lower surface of the upper plate.

In various embodiments, the gas supply unit may further comprise an insulator connected to an upper surface of the upper plate, wherein the insulator may be provided with a center hole fluidly communicating with the center injection hole and may be provided with a plural of outer holes, each of which fluidly communicating with the outer injection holes.

In various embodiments, the gas supply unit may further comprise a gas flow channel disposed between a lower surface of the divider plate and an upper surface of the shower plate and configured to fluidly communicate with the center through hole and perimeters of the zones.

In various embodiments, the gas supply unit may further comprise a gas divider disposed in the gas flow channel.

In various embodiments, the gas divider may be ring shape.

In various embodiments, the gas supply unit may further comprise a plural of gas splitters, each of which fluidly communicates with the outer holes.

In various embodiments, the gas supply unit may further comprise a controller configured to control flow rates of the gas splitters.

In accordance with exemplary embodiments of the disclosure, a substrate processing apparatus may be provided. The substrate processing apparatus may comprise a reaction chamber; a susceptor positioned in the reaction chamber constructed and arranged to support a substrate, wherein the apparatus may comprise the gas supply unit and a shower plate may be constructed and arranged to face the susceptor.

In various embodiments, the substrate processing apparatus may further comprise a substrate transport tube disposed in a sidewall of the reaction chamber, wherein the biggest zone of the zones may be disposed in a vicinity of the substrate transport tube.

In various embodiments, the substrate processing apparatus may further comprise a vacuum port disposed in a sidewall of the reaction chamber, wherein the biggest zone of the zones may be disposed in a vicinity of the vacuum port.

BRIEF DESCRIPTION OF THE DRAWING FIGURES

A more complete understanding of exemplary embodiments of the present disclosure can be derived by referring to the detailed description and claims when considered in connection with the following illustrative figures.

It will be appreciated that elements in the figures are illustrated for simplicity and clarity and have not necessarily been drawn to scale. For example, the dimensions of some of the elements in the figures may be exaggerated relative to other elements to help understanding of illustrated embodiments of the present disclosure.

DETAILED DESCRIPTION OF EXEMPLARY EMBODIMENTS

Although certain embodiments and examples are disclosed below, it will be understood by those in the art that the disclosure extends beyond the specifically disclosed embodiments and/or uses of the disclosure and obvious modifications and equivalents thereof. Thus, it is intended that the scope of the disclosure should not be limited by the particular embodiments described herein.

The illustrations presented herein are not meant to be actual views of any particular material, apparatus, structure, or device, but are merely representations that are used to describe embodiments of the disclosure.

In this disclosure, "gas" may include material that is a gas at normal temperature and pressure, a vaporized solid and/or a vaporized liquid, and may be constituted by a single gas or a mixture of gases, depending on the context. A gas other than the process gas, i.e., a gas introduced without passing through a gas supply unit, such as a shower plate, or the like, may be used for, e.g., sealing the reaction space, and may include a seal gas, such as a rare or other inert gas. The term inert gas refers to a gas that does not take part in a chemical reaction to an appreciable extent and/or a gas that can excite a precursor when plasma power is applied. The terms precursor and reactant can be used interchangeably.

As used herein, the term "substrate" may refer to any underlying material or materials that may be used, or upon which, a device, a circuit, or a film may be formed.

As used herein, the term "film" and "thin film" may refer to any continuous or non-continuous structures and material deposited by the methods disclosed herein. For example, "film" and "thin film" could include 2D materials, nanorods, nanotubes, or nanoparticles or even partial or full molecular layers or partial or full atomic layers or clusters of atoms and/or molecules. "Film" and "thin film" may comprise material or a layer with pinholes, but still be at least partially continuous.

Figure 1:
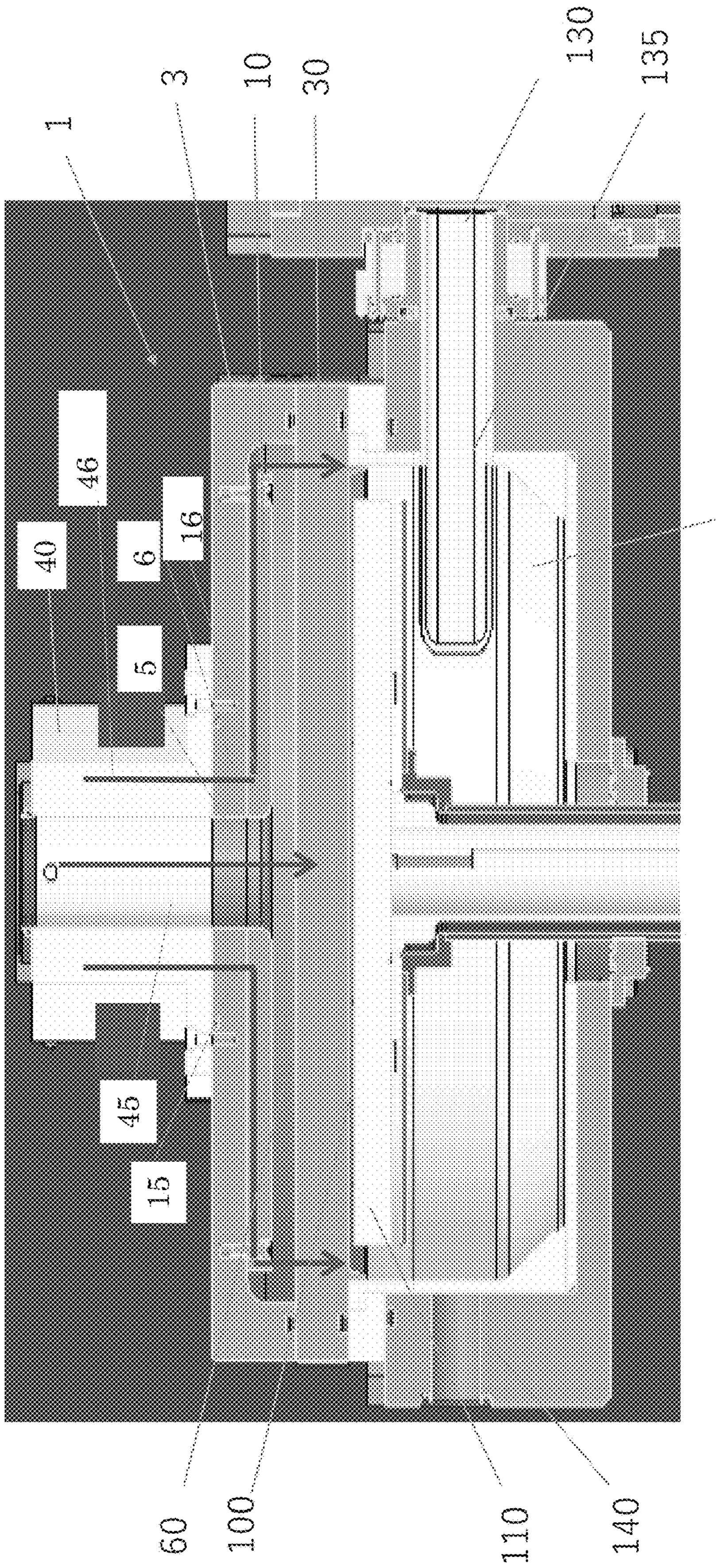
FIG. 1 is a schematic representation of a PECVD (plasma-enhanced chemical vapor deposition) apparatus for depositing a film usable in an embodiment of the present invention.

The process may be performed using any suitable apparatus including an apparatus illustrated in FIG. 1, for example. FIG. 1 is a schematic view of a PECVD apparatus. In this figure, by providing a pair of electrically conductive flat-plate electrodes 30, 110 in parallel and facing each other in the interior of a reaction chamber 100, applying high frequency RF power (for example, 13.56 MHz or 27 MHz) to one side of the upper flat-plate electrode 30, and electrically grounding the other side of the lower flat-plate electrode 110, a plasma may be excited between the electrodes. A temperature regulator may be provided in a susceptor 110 (the lower electrode), and a temperature of a substrate placed thereon may be kept constant at a given temperature. The upper flat-plate electrode 30 may serve as a shower plate as well, and gas may be introduced into the reaction chamber 100 through the shower plate or the upper flat-plate electrode 30. Additionally, in the reaction chamber 110, an exhaust line 140 may be provided, through which gas in the interior of the reaction chamber 100 may be exhausted.

Further, a transfer chamber 150 disposed below the reaction chamber 100 may be provided and the transfer zone may be provided. A gate valve 130 and a wafer transport tube 135 through which a wafer is transferred into or from the transfer chamber 150 may be provided. In some embodiments, a remote plasma unit may be used for exciting a gas.

In some embodiments, a multiple chamber module, for example two or four chambers or compartments for processing wafers disposed close to each other, may be used.

A skilled artisan may appreciate that the apparatus includes one or more controller(s) programmed or otherwise configured to cause the deposition and reactor cleaning processes described elsewhere herein to be conducted. The controller(s) may be communicated with the various power sources, heating systems, pumps, robotics, and gas flow controllers or valves of the reactor, as will be appreciated by the skilled artisan.

Figure 2:
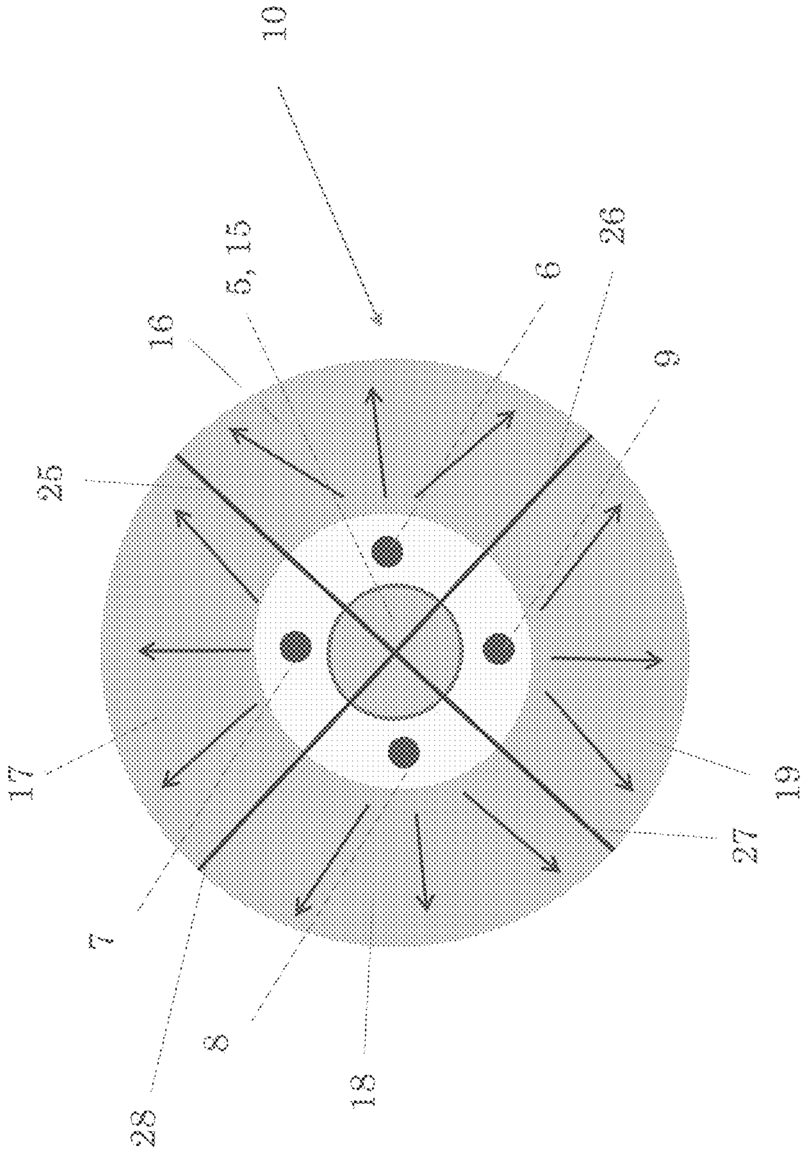
FIG. 2 is a schematic diagram of showing a gas supply unit including a divider plate.

With additional reference to FIG. 1 and FIG. 2, a gas supply unit 1 is illustrated. The gas supply unit 1 includes an upper plate 3 providing with a center injection hole 5 and a plurality of outer injection holes 6,7,8,9. The outer injection holes 6,7,8,9 are arranged concentrically around the center injection hole 5.

The gas supply unit 1 further includes a divider plate 10, which is configured and arranged against the upper plate 3. The divider plate 10 has a center through hole 15 fluidly communicating with the center injection hole 5 and a plurality of zones 16, 17, 18, 19, each of which fluidly communicating with the outer injection holes 6,7,8,9.

The gas supply unit 1 further includes a plurality of protrusions 25, 26, 27, 28, which are extending from the divider plate 10 toward the upper plate 3. The protrusions 25, 26, 27, 28 are configured to create the zones 16, 17, 18, 19, and may be arranged radially from the center to the outside. All zones 16, 17, 18, 19 may have substantially the same trapezoidal shape or the size of some zone may be bigger than that of other zones. The first zone 16 may be disposed in a vicinity of the wafer transport tube 135. The second zone 18 may be disposed in a vicinity of the vacuum port 140.

The gas supply unit 1 may further include a shower plate 30 having a plurality of holes to guide a flow of gas toward substrate. The shower plate 30 may be attached to a lower surface of the upper plate 3.

The gas supply unit 1 may further include an insulator 40, which is connected to an upper surface of the upper plate 3. The insulator 40 may include a center hole 45 fluidly communicating with the center injection hole 5 and a plurality of outer holes 46, 47, 48, 49 fluidly communicating with the outer injection holes 6,7,8,9.

The gas supply unit 1 may further comprise a gas flow channel 60 disposed between a lower surface of the divider plate 10 and a upper surface of the shower plate 30 and configured to fluidly communicate with the center through hole 15 and perimeters of the zones 16, 17, 18, 19.

Figure 3:
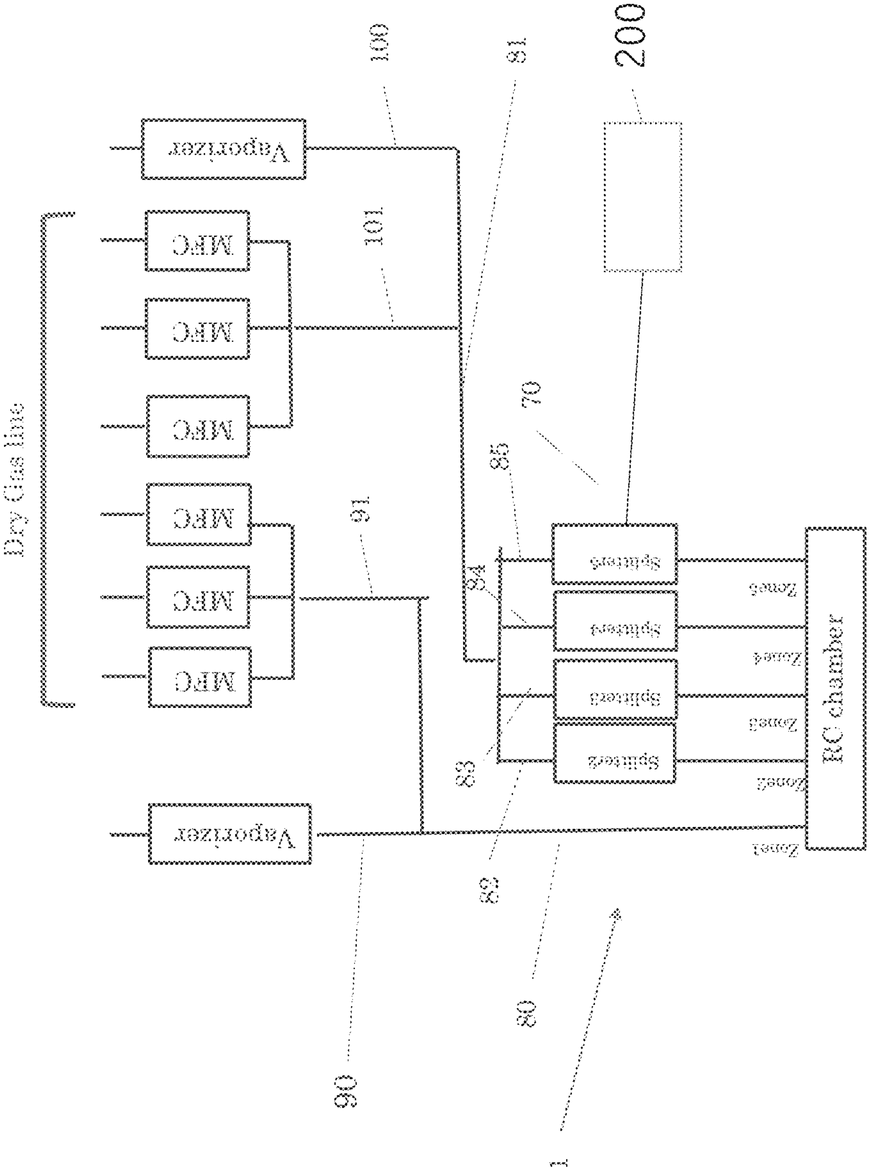
FIG. 3 is a schematic diagram of showing a gas supply unit including gas lines.

With additional reference to FIG. 3, the gas supply unit 1 includes a first gas line 80, which is fluidly coupled to the center hole 45 and the center injection hole 5. The first gas line 80 may be connected to a downstream of a first liquid gas line 90 and a first dry gas line 91. The gas supply unit 1 further includes a plurality of second gas lines 82,83,84, 85, which are fluidly coupled to the outer holes 46, 47, 48, 49 and the outer injection holes 6,7,8,9. The second gas lines 82, 83, 84, 85 may be connected to a common gas line 81. The common gas line 81 may be connected to a downstream of a second liquid gas line 100 and a second dry gas line 101. The first gas line 80 may have a first control knob, while the second gas lines 82, 83, 84, 85 may have a second control knob. The use of separate control knobs may allow for independent control of both total flow rate and partial pressure of reactive gas at the center and edge.

The gas supply unit 1 further may include a plurality of gas splitters 70, which fluidly communicate with the outer holes 46,47,48,49 respectively.

A carbon precursor as a liquid gas for forming a carbon layer may be introduced into the reaction chamber. Exemplary precursors include compounds represented by the formula CxHyNz, where x is a natural number greater than or equal to 2, y is a natural number, and z is zero or a natural number. For example, x may range from about 2 to about 15, y may range from about 4 to about 30, and z can range from about 0 to about 10. The precursor may include a chain or cyclic molecule having two or more carbon atoms and one or more hydrogen atoms, such as molecules represented by the formula above. By way of particular examples, the precursor may be or include one or more cyclic (e.g., aromatic) structures and/or compounds having at least one double bond, and in some cases including two or more or three or more double bonds. By way of particular examples, the carbon precursor may be or include 1,3,5, trimethylbenzene or 2,4,6, trimethylpyridine.

The one or more inert gases as dry gases may include, for example, one or more of argon, helium, and nitrogen, in any combination. The inert gas may be used to ignite a plasma or facilitate ignition of the plasma within the reaction chamber, to purge reactants and/or byproducts from the reaction chamber, and/or be used as a carrier gas to assist with delivery of the precursor to the reaction chamber. A power used to ignite and maintain the plasma may range from about 50 W to about 8,000 W. A frequency of the power may range from about 2.0 MHz to about 27.12 MHz.

The gas supply unit may include a controller 200, which is configured to control flow rates of the gas splitters 70. By adjusting the flow rates, the amount of gases in each zone 16,17,18,19 may be controlled. Therefore, the uniformity or characteristics of a film formed in a specific peripheral portion may be selectively controlled. For example, the uniformity of a film deposited in the zones 16 and 18 may be selectively controlled.

Figure 4:
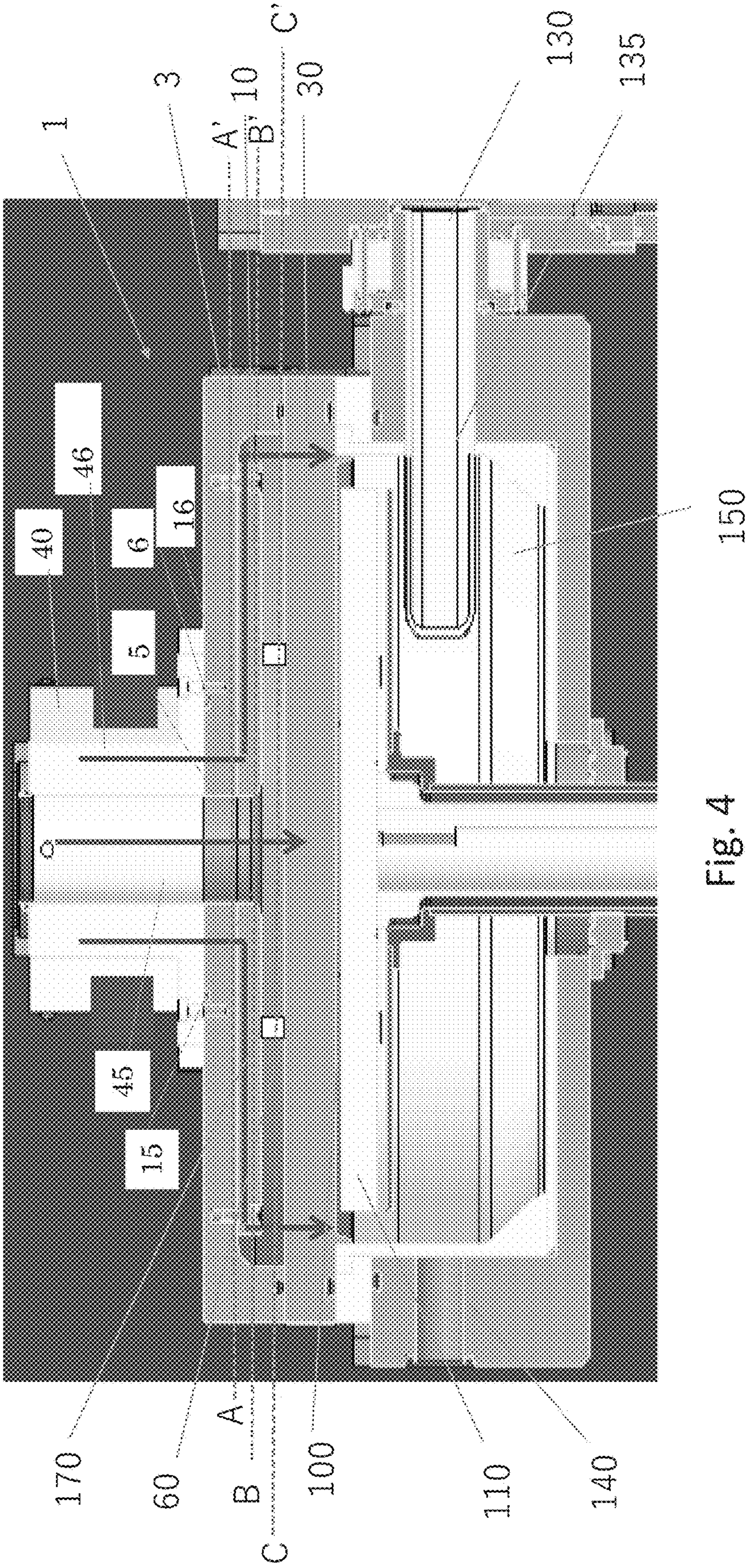
FIG. 4 is a schematic representation of a PECVD apparatus usable in another embodiment of the present invention.
Figure 5A:
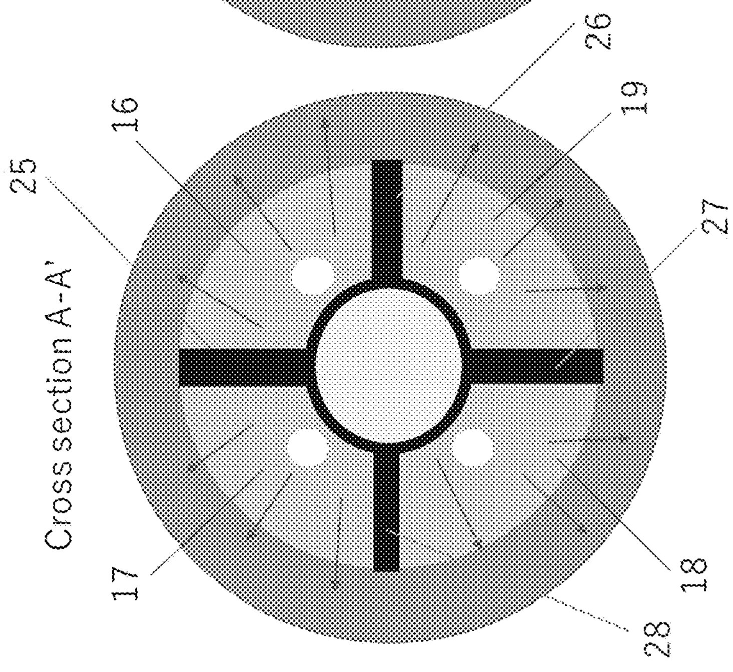
FIG. 5A is a cross-sectional view taken along line A-A' of FIG. 4.
Figure 5B:
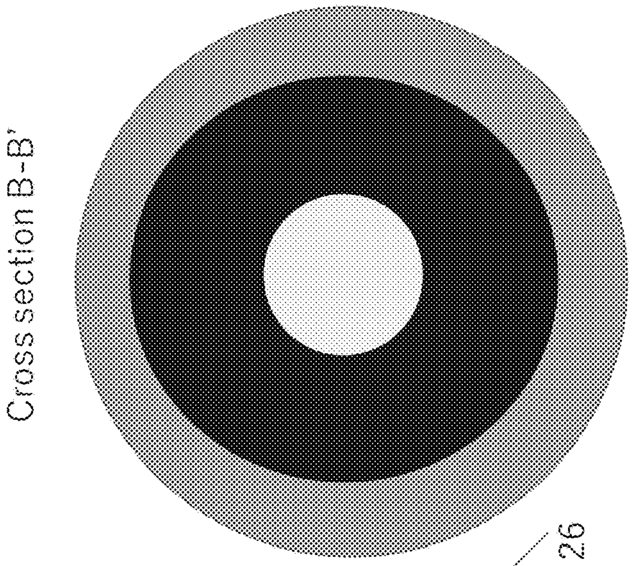
FIG. 5B is a cross-sectional view taken along line B-B' of FIG. 4.
Figure 5C:
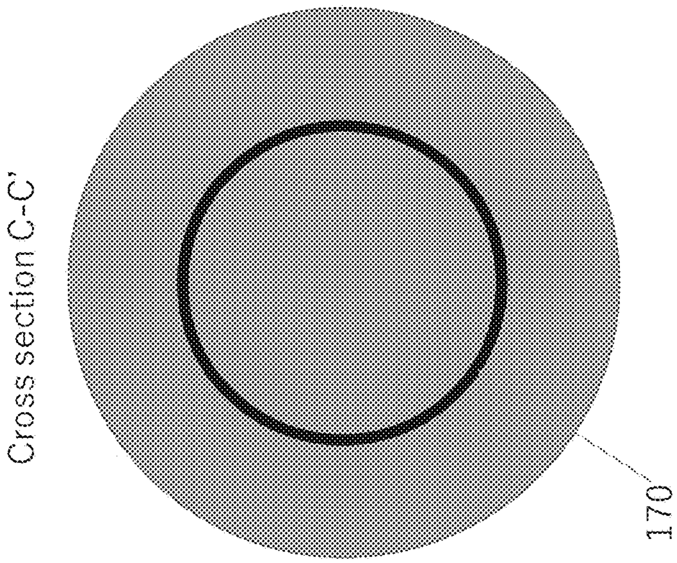
FIG. 5C is a cross-sectional view taken along line C-C' of FIG. 4.

With additional reference to FIG. 4, the gas supply unit 1 may further include a gas divider 170 disposed in the gas flow channel 60. As shown in FIG. 5, the gas divider 170 may be ring shape. The gas divider 170 may further improve controllability of flow rate between center and edge.

Figure 6C:
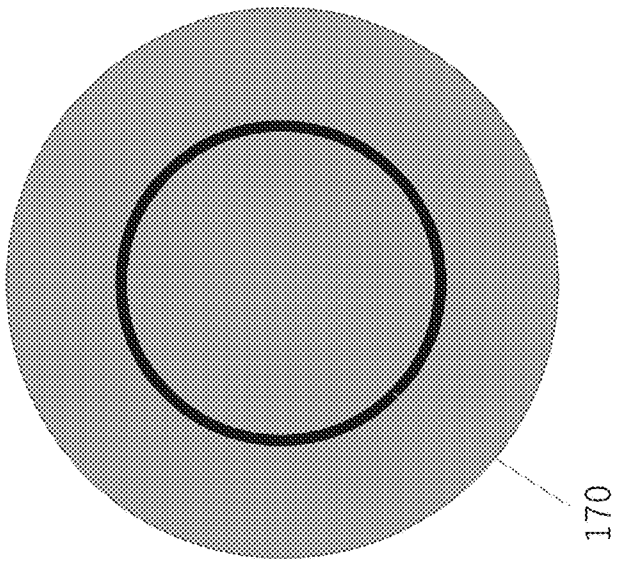
FIG. 6A to 6C are cross-sectional views of another embodiment.
Figure 6B:
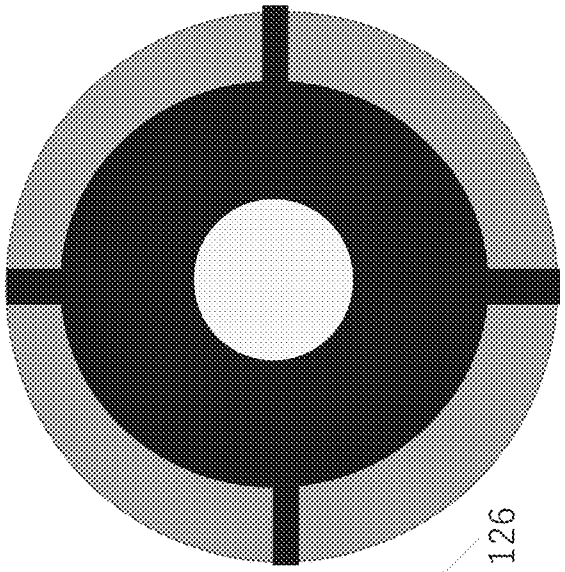
Figure 6A:
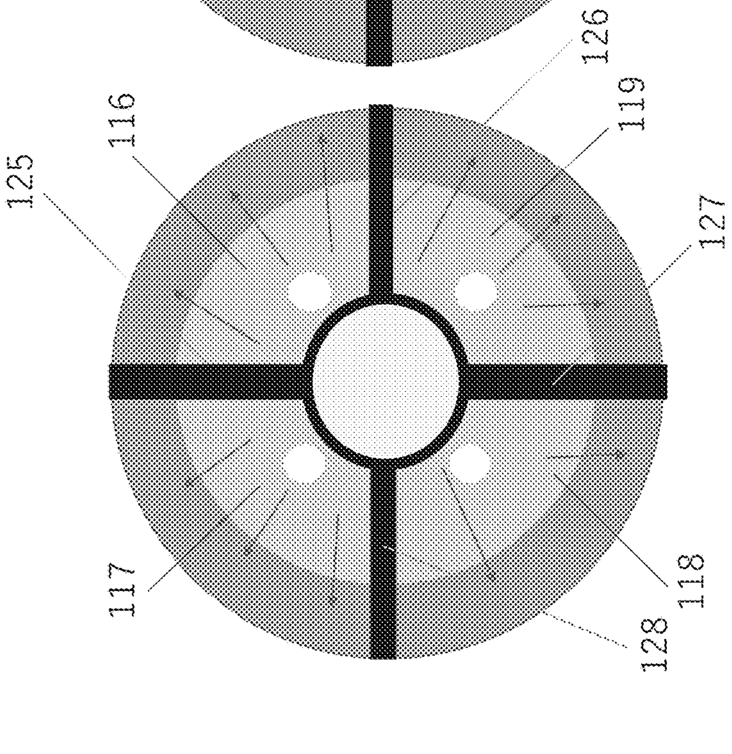

FIG. 6A to 6C are cross-sectional views of another embodiment. In this embodiment, protrusions 125, 126, 127, 128 are configured to create the zones 116, 117, 118, 119, and may be arranged radially from the center to the edge. The use of the protrusions 125, 126, 127, 128 may make more differences of flow rates between the zones 116, 117, 118, and 119.

Figure 7A:
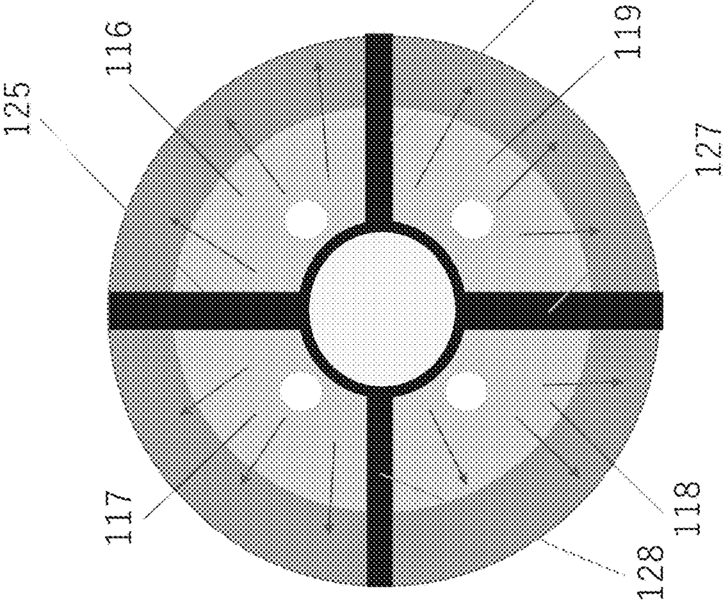
FIG. 7A to 7C are cross-sectional views of another embodiment.
Figure 7B:
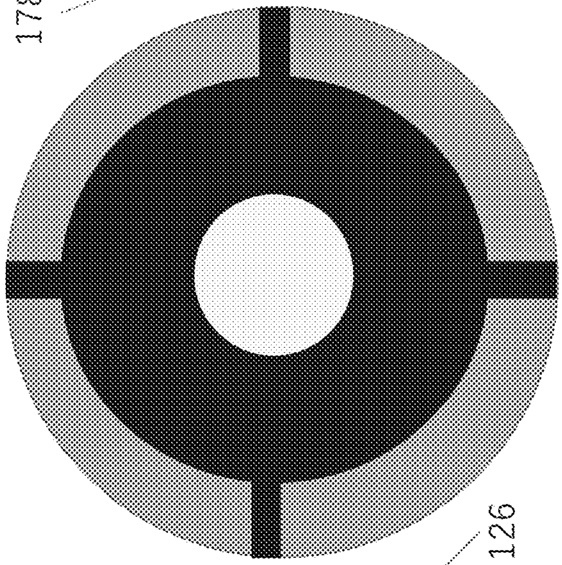
Figure 7C:
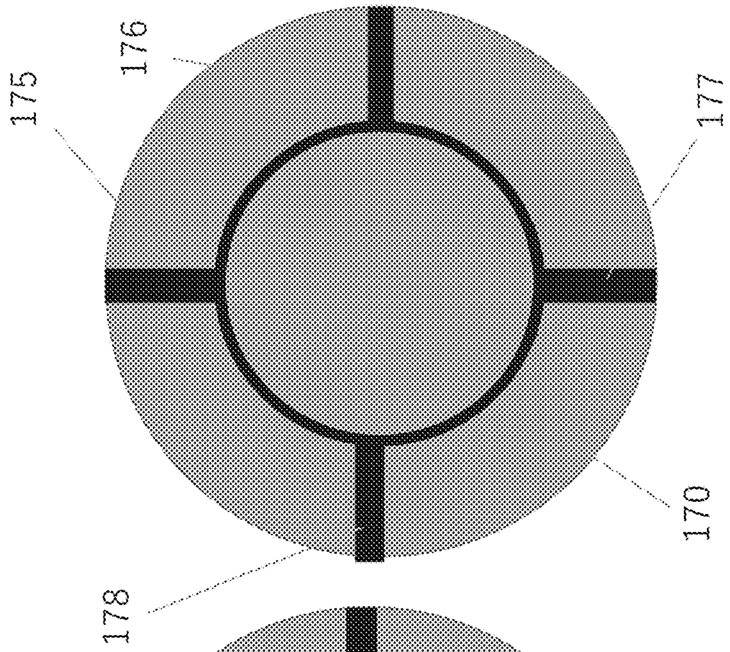

FIG. 7A to 7C are cross-sectional views of another embodiment. In this embodiment, the gas divider 170 may further include gas divider protrusions 175, 176, 177, 178, which are arranged radially from the gas divider 170 to the edge. The gas divider protrusions 175, 176, 177, 178 may be disposed to overlap the protrusions 125, 126, 127, 128. The use of the gas divider protrusions 175, 176, 177, 178 may make much more differences of flow rates between the zones 116, 117, 118, and 119.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A gas supply unit, comprising: an upper plate provided with a plurality of injection holes, the plurality of injection holes comprising a center injection hole and a plurality of outer injection holes; a divider plate constructed and arranged against the upper plate to guide a flow of gas from the injection holes; a first gas line fluidly coupled to the center injection hole; and a plurality of second gas lines fluidly coupled to the plurality of outer injection holes; wherein the plurality of outer injection holes is arranged concentrically around the center injection hole; and wherein the divider plate is provided with a center through hole fluidly communicating with the center injection hole and is provided with a plurality of protrusions extending towards the upper plate and extending from the center through hole to a perimeter of the divider plate thereby creating a plurality of zones, each of the zones fluidly communicating with one of the outer injection holes, and wherein each of the plurality of zones extends from the center through hole to the perimeter of the divider plate; and wherein the center through hole is configured to receive a gas from the center injection hole and to provide the gas through a shower plate.

2. The gas supply unit according to claim 1, further comprising a first liquid gas line and a first dry gas line configured to connect to an upstream of the first gas line.

3. The gas supply unit according to claim 1, further comprising a second liquid gas line and a second dry gas line configured to connect to an upstream of the second gas lines.

4. The gas supply unit according to claim 1, wherein at least one of the zones is provided with a substantially trapezoidal shape.

5. The gas supply unit according to claim 1, wherein the number of the zones is four, wherein the size of one zone is bigger than that of the other three zones.

6. The gas supply unit according to claim 1, wherein the protrusions are arranged radially from the center to the perimeter of the divider plate.

7. The gas supply unit according to claim 1, wherein the shower plate is provided with a plurality of holes to guide a flow of gas outside the gas supply unit, wherein the shower plate is attached to a lower surface of the upper plate.

8. The gas supply unit according to claim 1, further comprising an insulator connected to an upper surface of the upper plate, wherein the insulator is provided with a center hole fluidly communicating with the center injection hole and is provided with a plurality of outer holes, each of which fluidly communicating with the outer injection holes.

9. The gas supply unit according to claim 7, further comprising a gas flow channel disposed between a lower surface of the divider plate and an upper surface of the shower plate and configured to fluidly communicate with the center through hole and perimeters of the zones.

10. The gas supply unit according to claim 9, further comprising a gas divider disposed in the gas flow channel.

11. The gas supply unit according to claim 10, wherein the gas divider is ring shape.

12. The gas supply unit according to claim 11, further comprising gas divider protrusions arranged radially from the center of the gas divider to the edge.

13. The gas supply unit according to claim 8, further comprising a plurality of gas splitters, each of which fluidly communicates with the outer holes.

14. The gas supply unit according to claim 13, further comprising a controller configured to control flow rates of the gas splitters.

15. A substrate processing apparatus comprising:

a reaction chamber;

a susceptor positioned in the reaction chamber constructed and arranged to support a substrate, wherein the apparatus comprises the gas supply unit of claim 1 and the shower plate is constructed and arranged to face the susceptor.

16. The substrate processing apparatus of claim 15, further comprising a substrate transport tube disposed in a sidewall of the reaction chamber, wherein the biggest zone of the zones is disposed in a vicinity of the substrate transport tube.

17. The substrate processing apparatus of claim 14, further comprising a vacuum port disposed in a sidewall of the reaction chamber, wherein the biggest zone of the zones is disposed in a vicinity of the vacuum port.

18. The gas supply unit according to claim 1, wherein each of the zones includes about a quadrant of the divider plate.

* * * * *